THYRISTOR WITH POSITIVELY BEVELLED JUNCTIONS

Filed March 24, 1966

INVENTORS
OLLE EDQVIST
PER SVEDBERG
BENGT-ARNE VEDIN
BY
Bailey, Stephens & Huettig
ATTORNEYS United States Patent Office 3,437,886
Patented Apr. 8, 1969

3,437,886
THYRISTOR WITH POSITIVELY BEVELLED JUNCTIONS

Olle Edqvist, Jakobsberg, Per Svedberg, Vallingby, and Bengt-Arne Vedin, Jakobsberg, Sweden, assignors to Allmänna Svenska Elektriska Aktiebolaget, Vasteras, Sweden, a corporation of Sweden Filed Mar. 24, 1966, Ser. No. 537,101
Claims priority, application Sweden, Mar. 25, 1965, 3,849/65
Int. Cl. H01l 5/00
U.S. Cl. 317—234 1 Claim

ABSTRACT OF THE DISCLOSURE

A semiconductor device is formed of a disc-shaped semiconductor body having layers of different conductivity types and at least two pn-junctions between the layers. The thickness of the edge portion of the body is considerably thicker than the rest of the body, and is bevelled in such a way that the bevel angle is positive at at least two of the junctions.

Figure 1:
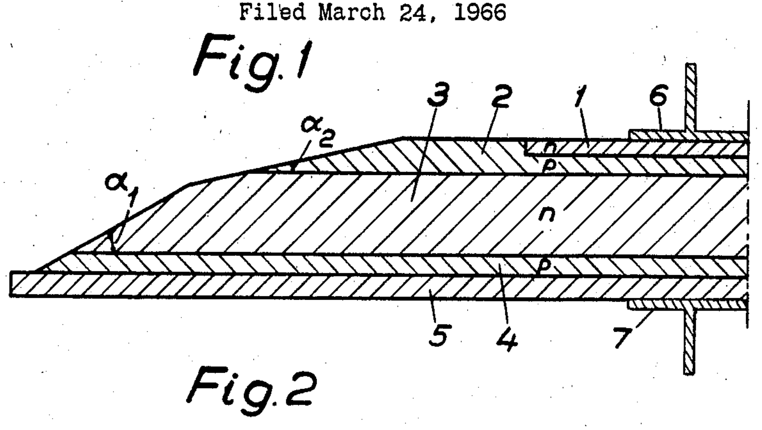

The present invention relates to a semiconductor device comprising a semiconductor body shaped like a disc and with at least two junctions between layers of different conductivity types. Thyristors are examples of such semiconductor devices.

It is of great practical and economic importance that such semiconductor devices can be made with as high permissible reverse and forward blocking voltages as possible. One factor which limits the development in this direction is the phenomena which occur at the edge surface of a semiconductor body. For different reasons breakdowns occur along the surface of a semiconductor at a lower field strength than is the case within the semiconductor body. If the semiconductor body is thus made as a disc where the edge surface of the disc is perpendicular to the plane of the disc and to the pn-junctions, breakdowns will thus take place at the edge surface and the blocking properties of the conductor material of the blocking pn-junction cannot be fully utilised.

Devices are known in which the edge surface is bevelled. It thereby becomes wider, but this does not always automatically give a lower field strength at the surface. The conditions are different, depending on whether the so-called bevel angle is positive or negative. The definition of the expression "bevel angle" is evident from FIG. 1 where $\alpha_1$ and $\alpha_2$ are the bevel angles at the two lowest pn-junctions in the thyristor shown in cross section. The bevel angle at a certain pn-junction is thus the angle between the edge surface and the plane of the pn-junction. The bevel angle at any given junction is called positive if the cross sectional area of the semiconductor body is reduced in the direction towards the more lightly doped layer. In a thyristor according to FIG. 1 the lower n-conducting layer (n-base layer) is usually more lightly doped than the surrounding p-conducting layers. At the lower pn-junction therefore the bevel angle ($\alpha_1$) is positive and at the centre junction the bevel angle ($\alpha_2$) is negative. For positive bevel angles, when the bevel angle is reduced from 90°, the maximum field strength at the surface will be continuously decreasing. For negative bevel angles, when the bevel angle is reduced from 90°, the maximum field strength will increase to a peak value, which can occur at a bevel angle of, for example, 40–50°. After this the maximum field strength diminishes. With a positive bevel angle it is sufficient to reduce the bevel angle to, for example 20° in order to prevent breakdowns at the edge surface. With a negative bevel angle on the other hand the bevel angle must be reduced for example, to 2° or 3° in order that the same effect may be produced.

The active area of the semiconductor body is substantially the same as the area of the layer which has the smallest cross section. With the small bevel angles, which are necessary when the bevel angle at a junction is negative, the greatest cross sectional area of the semiconductor body will be much greater than its active area. This makes the semiconductor device expensive and difficult to manufacture. Further, the unnecessarily large crystal disc will be subjected to strong mechanical stresses under temperature variations. The likelihood of the semiconductor body containing defects also increases, of course, with the area.

It is known to make the bevelling of the edge surface curved instead of straight. In this way a certain reduction of the ratio between the greatest cross sectional area of the semiconductor body and its active area can be produced, but this is carried out at the expense of considerably increased manufacturing difficulties.

According to the invention the said disadvantages in the known devices can to a great extent be reduced. The invention is characterised in that the semiconductor body is considerably thicker along the edge than in the remaining part and that the edge is shaped so that at at least two of the junctions the bevel angle is positive.

Figure 2:
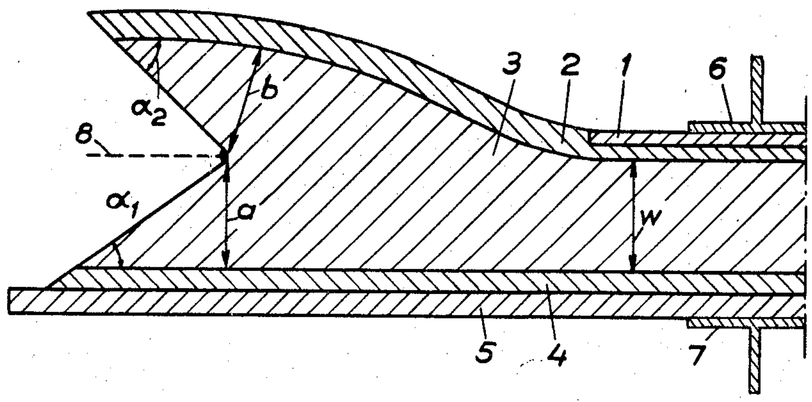
Figure 3:
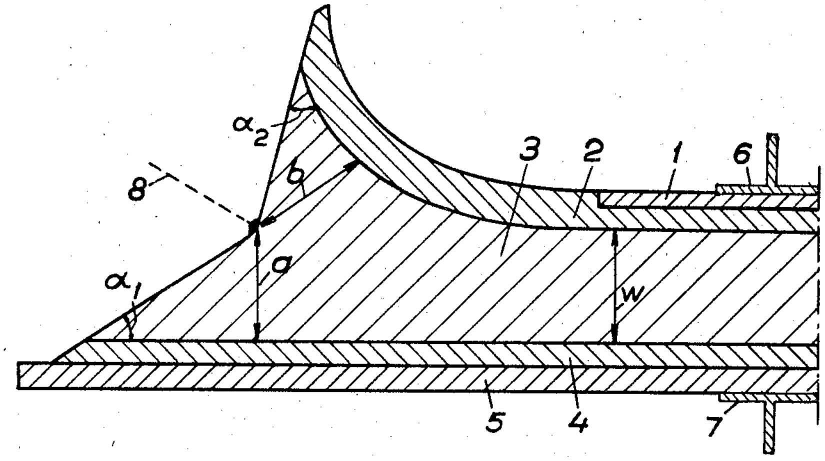

The invention will be described in more detail in connection with the accompanying drawings, where FIG. 1 shows a previously known device, FIG. 2 shows a section through a thyristor according to the invention where the edge is provided with a substantially wedge-shaped notch, and FIG. 3 shows a cross section through a thyristor according to another embodiment of the invention.

As previously mentioned FIG. 1 shows a cross section through a thyristor with a previously known shape of the edge surface. The numerals 1, 2, 3 and 4 are n-emitter, p-base, n-base and p-emitter layers respectively. The numeral 5 is the base plate and 6 and 7 are cathode and anode connections respectively. The n-base layer 3 is more lightly doped than the surrounding p-conducting layers. The beveled angle at the centre pn-junction ($\alpha_2$) thus becomes negative and must be small (2–3°) with the accompanying disadvantages mentioned above.

FIG. 2 shows a cross section through a thyristor according to the invention. The semiconductor body is as seen considerably thicker at the edge than in the central part. This has been achieved by making the n-base layer 3 thicker at the edge. By providing the edge of the thyristor being with a wedge-shaped notch both the bevel angles $\alpha_1$ and $\alpha_2$ become positive. As positive bevel angles can be made relatively large, for example approximately 20°, without detrimental surface phenomena occurring, the problem of the negative bevel angle necessitating very small edge angles as in the previously known devices is avoided.

Thyristors for higher voltages are usually provided with so-called short-circuited emitters, that is the p-base layer 2 is short-circuited to the n-emitter layer 1, for example by a metallic surface layer. The junction between these two layers cannot then take up any reverse voltage worth mentioning, and only the lower junction (between the layers 3 and 4) is left to absorb the reverse blocking voltage of the thyristor. The centre junction (between the layers 2 and 3) as is known takes up the forward blocking voltage of the thyristor. When a pn-junction is reverse-biased, a so-called depletion layer on both sides of the junction is formed, in which free charge carriers are missing. This layer is thicker on the side of the junction which is more lightly doped. When a pn-junction is fully utilised from the inverse voltage point of view, the depletion layer extends over practically all the more lightly doped layer, that is the depletion layer has the thickness $w$ (see FIG. 2). The semiconductor body should have the desired positive bevel angle within the complete depletion layer. This is achieved, regardless of whether the thyristor blocks in the forward or reverse direction, if according to the invention the edge of the semiconductor body is shaped so that the distances $a$, $b$ and $w$ are substantially equally large.

The radius of curvature of the transition between the thicker edge of the semiconductor body and its plane part should be large compared with the thickness of the n-base layer in order to avoid unnecessary electrical and thermic stresses.

In the inner part of the wedge-shaped notch, a bias contact 8 may be placed, which is given such a potential that the pn-junctions lying on both sides of the n-base layer will be reverse biased, whereby non-desirable injection of charge carriers towards the junction, which takes up the blocking voltage of the thyristor, is prevented.

A protective layer of a material with suitable dielectric characteristics can suitably be placed on the edge surface of the semiconductor body.

FIG. 3 shows another embodiment of a thyristor according to the invention. 1, 2, 3 and 4 are, as previously, n-emitter, p-base, n-base and p-emitter layers. 5 is the base plate and 6 and 7 the cathode and anode connections respectively. The edge surface of the semiconductor body is here shaped in a somewhat different way. However also here the result is achieved that the bevel angles $\alpha_1$ and $\alpha_2$ are positive. The distances $a$ and $b$ are also here preferably made substantially equal to the thickness $w$ of the n-base layer for the same reason as in the device according to FIG. 2.

In this embodiment also a bias contact 8 may be connected to the n-base layer.

The thyristors dealt with in the figures and the description comprise an n- p-, n- and p-conducting layer. Of course the thyristors shown may also comprise a p- n-, p- and n-conducting layer, counted in the same direction.

The invention is only shown with reference to thyristors, but is also suitable for other semiconductor devices with at least two pn-junctions. A large number of embodiments apart from those shown above, is, of course, feasible within the scope of the invention.

Compared with previously known devices, the device according to the invention offers the advantage that the ratio between the active area of the semi-conductor body and its greatest cross sectional area may be considerably increased, which is of great economic and practical importance. Further, the field distribution along the edge surface will be equally favourable when the thyristor is in the forward blocking stage as when it is blocking in the reverse direction, whereby the maximum permissible forward blocking voltage of the thyristor can be increased.

We claim:

1. A semiconductor device comprising a disc-shaped semiconductor body, said body having first, second, third and fourth layers, counted from one surface of the disc, said layers being of alternately opposite conductivity types, said second layer having a considerably greater thickness at the edge of the semiconductor body than in the central part, the peripheral edge of said semiconductor body having a wedge-shaped notch, the sides of said notch forming positive angles with the two junctions between said second layer and said first and third layers, the shortest distances from the innermost part of said notch to said two junctions being substantially equal to each other and to the thickness of the central part of said second layer.

References Cited

UNITED STATES PATENTS

| | | | |
|---|---|---|---|
| 2,980,830 | 4/1961 | Shockley | 317—235 |
| 3,055,776 | 9/1962 | Stevenson et al. | 317—235 |
| 3,370,209 | 2/1968 | Davis et al. | 317—235 |

FOREIGN PATENTS

| | | |
|---|---|---|
| 1,003,654 | 6/1965 | Great Britain. |
| 1,360,744 | 4/1964 | France. |
| 1,386,650 | 12/1964 | France. |

JOHN W. HUCKERT, *Primary Examiner.*

J. D. CRAIG, *Assistant Examiner.*

U.S. Cl. X.R.

317—235